United States Patent
Liu et al.

(10) Patent No.: US 9,680,422 B2
(45) Date of Patent: Jun. 13, 2017

(54) POWER AMPLIFIER SIGNAL COMPENSATION

(71) Applicant: QUALCOMM Incorporated, San Diego, CA (US)

(72) Inventors: Qijia Liu, San Diego, CA (US); Jifeng Geng, San Diego, CA (US); Daniel Fred Filipovic, San Diego, CA (US); Li Gao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 136 days.

(21) Appl. No.: 14/154,022

(22) Filed: Jan. 13, 2014

(65) Prior Publication Data

US 2014/0292403 A1    Oct. 2, 2014

Related U.S. Application Data

(60) Provisional application No. 61/805,845, filed on Mar. 27, 2013.

(51) Int. Cl.
| | |
|---|---|
| *H04B 1/04* | (2006.01) |
| *H01Q 11/12* | (2006.01) |
| *H03F 1/32* | (2006.01) |
| *H03F 1/30* | (2006.01) |
| *H03F 3/195* | (2006.01) |
| *H03F 3/24* | (2006.01) |
| *H04L 27/36* | (2006.01) |

(52) U.S. Cl.
CPC ............ *H03F 1/3241* (2013.01); *H03F 1/30* (2013.01); *H03F 1/3247* (2013.01); *H03F 3/195* (2013.01); *H03F 3/245* (2013.01); *H04L 27/368* (2013.01); *H03F 2200/111* (2013.01); *H03F 2200/336* (2013.01); *H03F 2200/447* (2013.01); *H03F 2201/3233* (2013.01)

(58) Field of Classification Search
CPC ....... H03R 1/30; H03F 1/3247; H03F 1/3247; H03F 1/03
USPC .................... 455/114.3, 126–127.2
See application file for complete search history.

(56) References Cited

U.S. PATENT DOCUMENTS 6,909,756 B1 * 6/2005 Nakajima ............ H03F 1/3247
                                                                    327/317
7,006,791 B2    2/2006 Buer
7,519,330 B2    4/2009 Gumm
(Continued)

FOREIGN PATENT DOCUMENTS

| EP | 1511181 A1 | 3/2005 |
|---|---|---|
| WO | 2010124297 A1 | 10/2010 |

OTHER PUBLICATIONS

International Search Report and Written Opinion—PCT/US2014/031979—ISA/EPO—Jun. 12, 2014

(Continued)

*Primary Examiner* — Simon Nguyen
(74) *Attorney, Agent, or Firm* — Arent Fox, LLP

(57) ABSTRACT

Exemplary embodiments are related to power amplifier power level compensation in a pre-distortion system. A method may include applying digital pre-distortion (DPD) of a power amplifier at a frequency channel, a fixed input power value, and a fixed temperature. The method may also include determining an optimal input power value for the power amplifier in response to a change in at least one of frequency and temperature.

13 Claims, 12 Drawing Sheets

(56) References Cited

U.S. PATENT DOCUMENTS

| | | | |
|---|---|---|---|
| 8,750,364 B2* | 6/2014 | Rosendahl | H03H 17/0294 375/232 |
| 2003/0016083 A1* | 1/2003 | Joly | H03F 1/302 330/296 |
| 2004/0017257 A1* | 1/2004 | Kim | H03F 1/3247 330/149 |
| 2005/0227646 A1 | 10/2005 | Yamazaki et al. | |
| 2006/0087372 A1* | 4/2006 | Henze | H03F 1/0222 330/136 |
| 2007/0190952 A1* | 8/2007 | Waheed | H04B 1/0475 455/114.3 |
| 2007/0264942 A1* | 11/2007 | Wu | H03F 1/0205 455/73 |
| 2008/0058026 A1* | 3/2008 | Jeong | H03G 3/3042 455/572 |
| 2008/0218270 A1* | 9/2008 | Hau | H03F 1/0261 330/289 |
| 2009/0195309 A1 | 8/2009 | Yamaoka | |
| 2009/0256630 A1* | 10/2009 | Brobston | H03F 1/3247 330/2 |
| 2009/0291651 A1* | 11/2009 | Takahashi | H03F 1/30 455/115.1 |
| 2010/0222015 A1* | 9/2010 | Shimizu | H03F 1/02 455/102 |
| 2011/0025414 A1* | 2/2011 | Wolf | H03F 1/3247 330/149 |
| 2011/0037519 A1 | 2/2011 | Pletcher et al. | |
| 2011/0095819 A1* | 4/2011 | Velazquez | H03F 1/3247 330/149 |
| 2011/0136452 A1* | 6/2011 | Pratt | H03F 1/3241 455/127.1 |
| 2012/0112847 A1* | 5/2012 | Nakamura | H03F 1/0205 332/145 |
| 2012/0155572 A1* | 6/2012 | Kim | H03F 1/3247 375/297 |
| 2012/0194271 A1* | 8/2012 | Yamamoto | H04B 1/0475 330/149 |
| 2012/0250749 A1* | 10/2012 | Tadano | H03F 1/02 375/224 |
| 2012/0281772 A1* | 11/2012 | Bailey | H03F 1/3247 375/259 |
| 2013/0226489 A1* | 8/2013 | Sogl | H04L 27/368 702/69 |

OTHER PUBLICATIONS

Tenbroek, et al., "Single-Chip Tri-Band WCDMA/HSDPA Transceiver without External SAW Filters and with Integrated Tx Power Control," 2008 IEEE International Solid-State Circuits Conference (Paper).

Tenbroek, et al.,"Single-Chip Tri-Band WCDMA/HSDPA Transceiver without External SAW Filters and with Integrated Tx Power Control," 2008 IEEE International Solid-State Circuits Conference (Powerpoint Presentation).

* cited by examiner

POWER AMPLIFIER SIGNAL COMPENSATION

CROSS-REFERENCE TO RELATED APPLICATION(S)

This application claims the benefit of U.S. Provisional Application Ser. No. 61/805,845, entitled "SEPARATE PIN AND POUT COMPENSATION FOR PREDISTORTED SIGNALS" and filed on Mar. 27, 2013, which is expressly incorporated by reference herein in its entirety.

BACKGROUND

Field

The present invention relates generally to input and output power compensation for pre-distorted transmit signals.

Background

Electronic amplifiers are used for increasing the power and/or amplitude of various electronic signals. Most electronic amplifiers operate by using power from a power supply, and controlling an output signal to match the shape of an input signal, while providing a higher amplitude signal. One widely used type of electronic amplifier is a power amplifier, which is a versatile device used in various applications to meet design requirements for signal conditioning, special transfer functions, analog instrumentation, and analog computation, among others. Power amplifiers are often used in wireless applications, and may employ radio-frequency (RF) amplifier designs for use in the RF range of the electromagnetic spectrum. An RF power amplifier is a type of electronic amplifier used to convert a low-power RF signal into a signal of significant power, typically for driving an antenna of a transmitter. RF power amplifiers are oftentimes used to increase the range of a wireless communication system by increasing the output power of a transmitter.

Power amplifiers typically do not behave in a linear manner. More particularly, power amplifier distortion may compress or may expand an output signal swing of a power amplifier. Signal detectors receiving and decoding the amplified signals typically do not operate in such a non-linear fashion. Therefore, it is usually necessary to linearize an output of a power amplifier. One approach to such linearization is digital pre-distortion (DPD). Digital pre-distortion may be calibrated and used with power amplifiers to invert power amplifier distortion characteristics by expanding compression regions and compressing expansion regions of power amplifier characteristics. However, as will be appreciated by a person having ordinary skill in the art, over frequency, temperature, and/or voltage standing wave ratio (VSWR), characteristics of a power amplifier may change. As a result, performance of a transmitter including a power amplifier may degrade significantly because the calibrated DPD no longer aligns with the nonlinearity of the power amplifier.

A need exists for embodiments related to enhancing a process of calibrating signal power levels of a power amplifier within a system including DPD.

DETAILED DESCRIPTION

Figure 1:
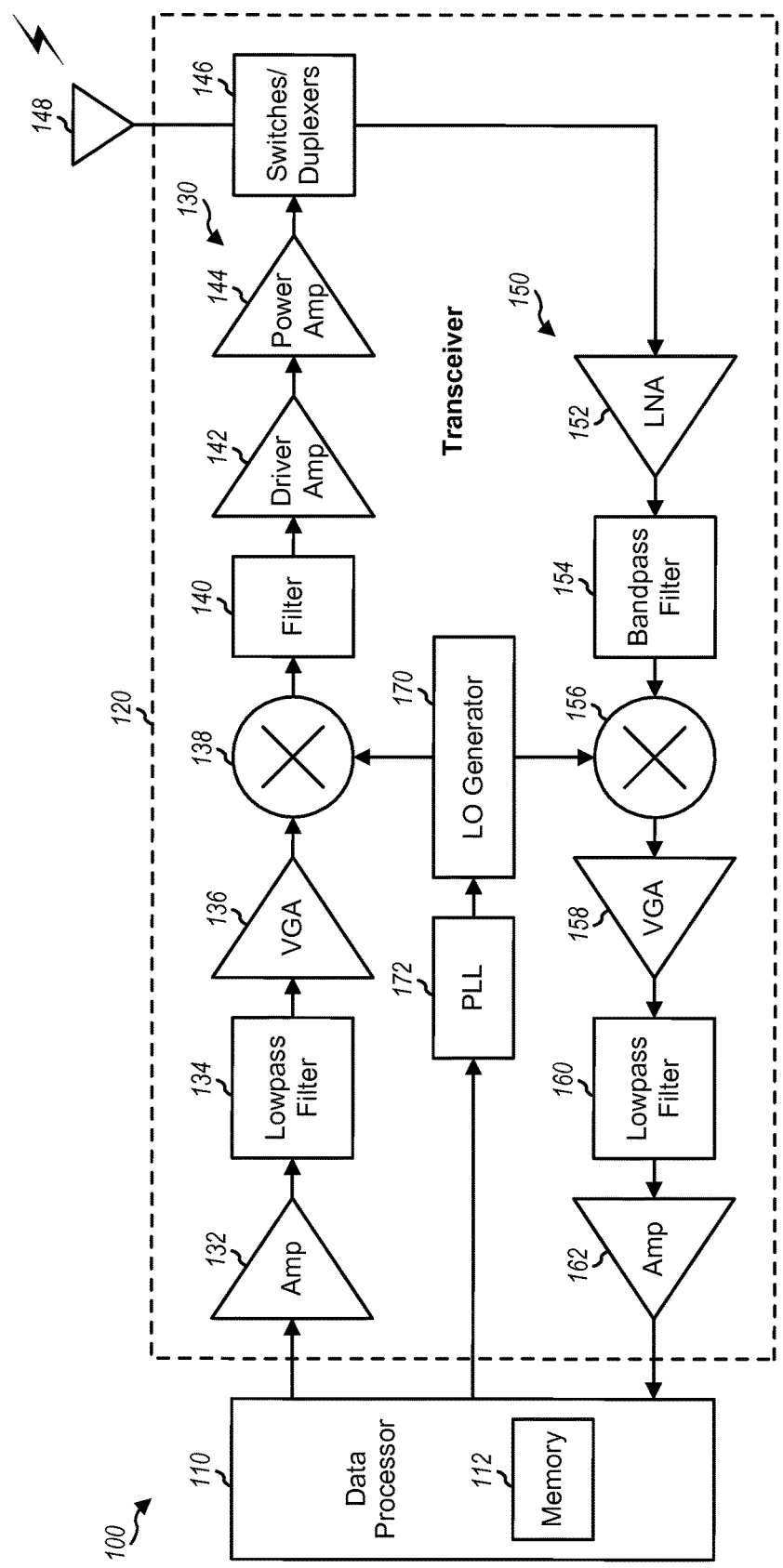
FIG. 1 illustrates a block diagram of a wireless communication device.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As noted above, DPD techniques may be used to improve the linearity of a power amplifier. However, over frequency, temperature, and/or voltage standing wave ratio (VSWR), characteristics of a power amplifier and/or a duplexer may change. As a result, an input compression point of the power amplifier may change, and adjacent channel leakage ratio (ACLR) may degrade significantly because a calibrated DPD no longer aligns with the nonlinearity of the power amplifier. Further, an output saturation power may change over temperature and VSWR, and a transmitter may experience front-end loss (e.g., duplexer attenuation varies over frequency/temperature). Conventional methods for linearizing a power amplifier may include dividing each frequency band of a plurality of frequency bands into several sections (e.g., 10 MHz sections), and constructing DPD calibration for each section. However, this method may suffer from a significant amount of calibration time, unsatisfactory ACLR/Pout across frequency/VSRW, and complicated implementations.

Exemplary embodiments, as described herein, are directed to devices and methods for calibrating a mobile communication device, such as a mobile telephone. More specifically, exemplary embodiments may include methods for separately compensating input and output power values for a power amplifier of a wireless transmitter. Various embodiments of such a method may include applying DPD of a power amplifier at a frequency channel, a fixed input power value, and a fixed temperature. The method may further include determining an optimal input power value for the power amplifier in response to a change in at least one of frequency and temperature.

According to one specific embodiment, determining the optimal input power value may include measuring adjacent channel leakage ratios (ACLRs) for a plurality of input power values and a plurality of frequency channels with the calibrated DPD, and selecting the optimal static input power value for the power amplifier for each frequency channel of the plurality of frequency channel based on the measured ACLRs.

According to another exemplary embodiment, a device may include a transmit path including a power amplifier. Further, the device may include a feedback path coupled to the transmit path and including at least one detection unit configured to sense a plurality of signals associated with a power amplifier during operation thereof. The device may also include a processor coupled to the at least one detection unit. The processor may be configured to calculate at least one parameter associated with the power amplifier based on the sensed plurality of signals and adjust an input power level of the power amplifier based on the at least one calculated parameter to reach a target parameter.

Other aspects, as well as features and advantages of various aspects, of the present invention will become apparent to those of skill in the art through consideration of the ensuing description, the accompanying drawings and the appended claims.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to RF by a mixer 138. The upconverted signal is filtered by a filter 140, further amplified by a driver amplifier 142 and a power amplifier 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a super-heterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuits may be arranged differently from the configuration shown in FIG. 1. Furthermore, other circuits not shown in FIG. 1 may also be used in transmitter 130 and receiver 150. For example, matching circuits may be used to match various active circuits in FIG. 1. Some circuits in FIG. 1 may also be omitted. All or a portion of transceiver 120 may be implemented on one or more analog integrated circuits (ICs), RF ICs (RFICs), mixed-signal ICs, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for transmitted and received data. Memory 112 may store program codes and data for data processor 110. Data processor 110 may be implemented on one or more application specific integrated circuits (ASICs) and/or other ICs.

Figure 2:
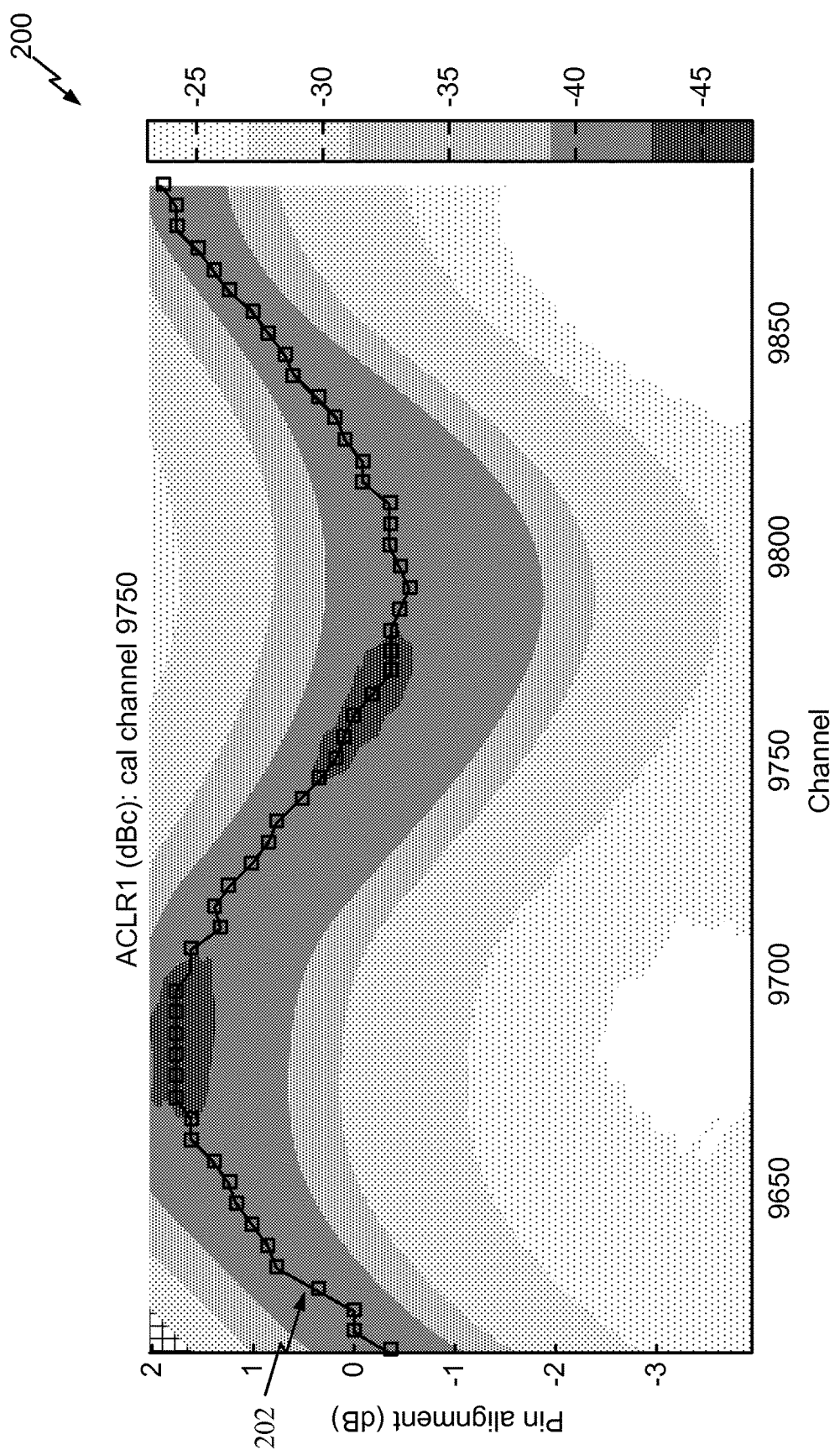
FIG. 2 is a grayscale plot illustrating adjacent channel leakage ratio (ACLR) of a wireless transmitter with digital pre-distortion.

FIG. 2 is a grayscale plot 200 illustrating ACLR of a transmitter, wherein DPD of the transmitter was calibrated at a frequency WCDMA channel of 9750 (1950 MHz). Further, a curve 202 in plot 200 illustrates an optimal input power alignment relative to frequency channel for given ACLRs. It is noted that the input power alignment value for the calibrated channel 9750 is 0 dB, which gives an acceptable ACLR (i.e., around −45 dBc). However, if the input power alignment value was static for other frequency channels, the ACLR may degrade substantially. For example, if the input power alignment value remained at 0 dB for the frequency channel 9700, the ACLR would be around −35 dBc, which is much worse than −45 dBc. Therefore, because characteristics of a power amplifier change upon a change in frequency channel, the input power value of the power amplifier may be adjusted to optimize a response of the power amplifier.

Figure 3:
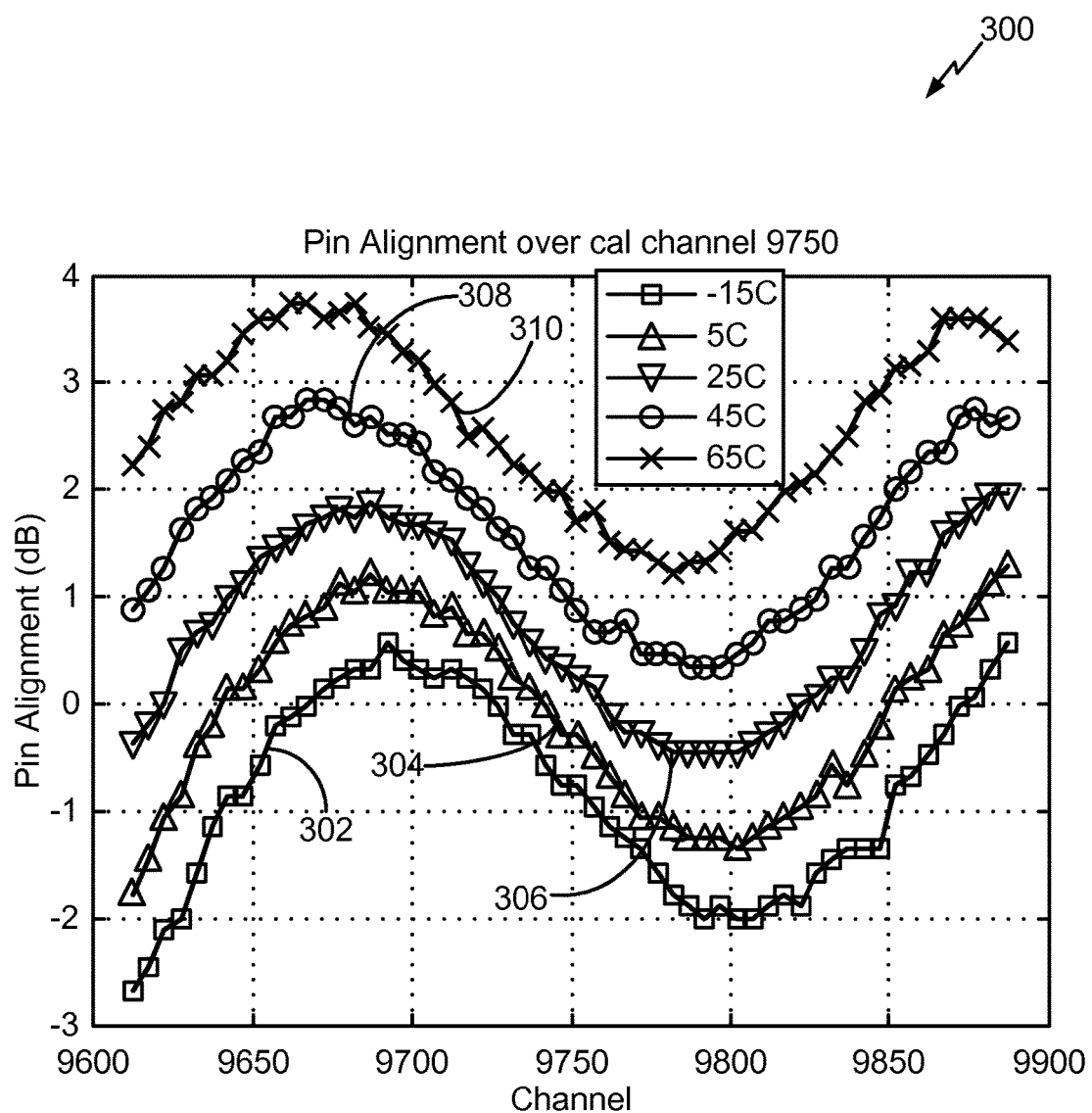
FIG. 3 is a plot depicting optimal input power values for a power amplifier across a plurality of frequency channels for a plurality of temperatures.

According to one exemplary embodiment of the present invention, a method includes determining an optimal input power value of a power amplifier for a plurality of frequency channels and a plurality of temperatures. The method, which may be performed during device manufacture, includes calibrating, at a selected frequency channel, a fixed input power value, and a fixed temperature (e.g., room temperature), DPD to linearize the power amplifier at the selected frequency channel. Further, with the calibrated DPD, ACLR may be measured for various input power values across a plurality of frequency channels. Stated another way, the method may include sweeping across frequency channels and input power values and measuring ACLR. An output power of the power amplifier may also be measured. Theses measurements may be recorded. For each frequency channel of the plurality of frequency channels, the input power value that gives an optimal ACLR value may be designated as the optimal input power alignment value for that frequency channel. This process may then be repeated across temperatures resulting in optimal input power value curves, as illustrated in plot 300 of FIG. 3. With reference to FIG. 3, curves 302, 304, 306, 308, and 310 depict optimal input power alignment values across a plurality of frequency channels for temperatures of −15 degrees Celsius, 5 degrees Celsius, 25 degrees Celsius, 45 degrees Celsius, and 65 degrees Celsius, respectively.

Figure 4:
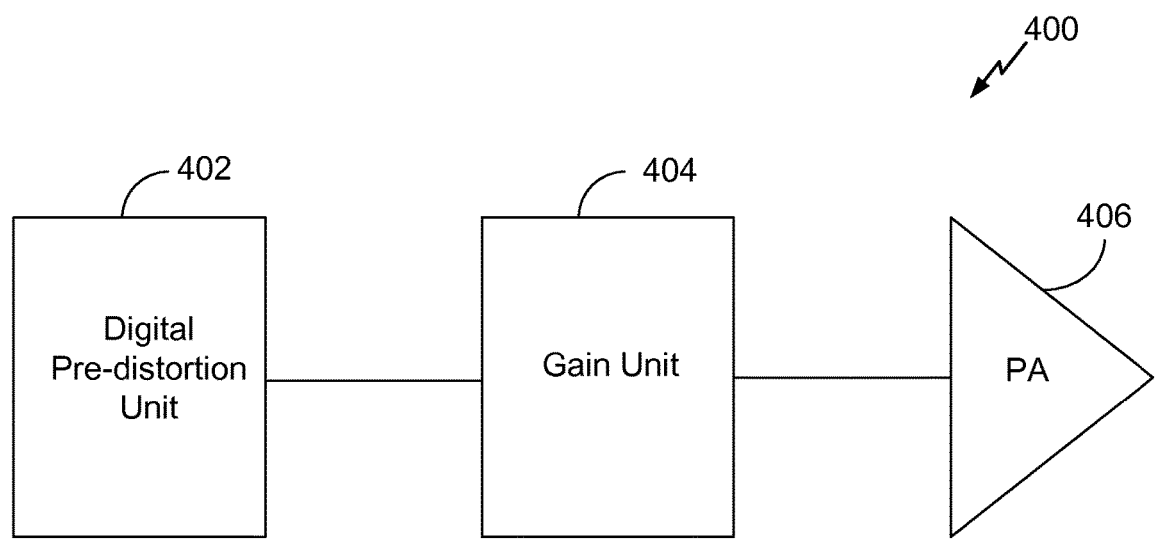
FIG. 4 illustrates a device, which is an example of a device that may be used for carrying out various embodiments of the present invention.
Figure 5:
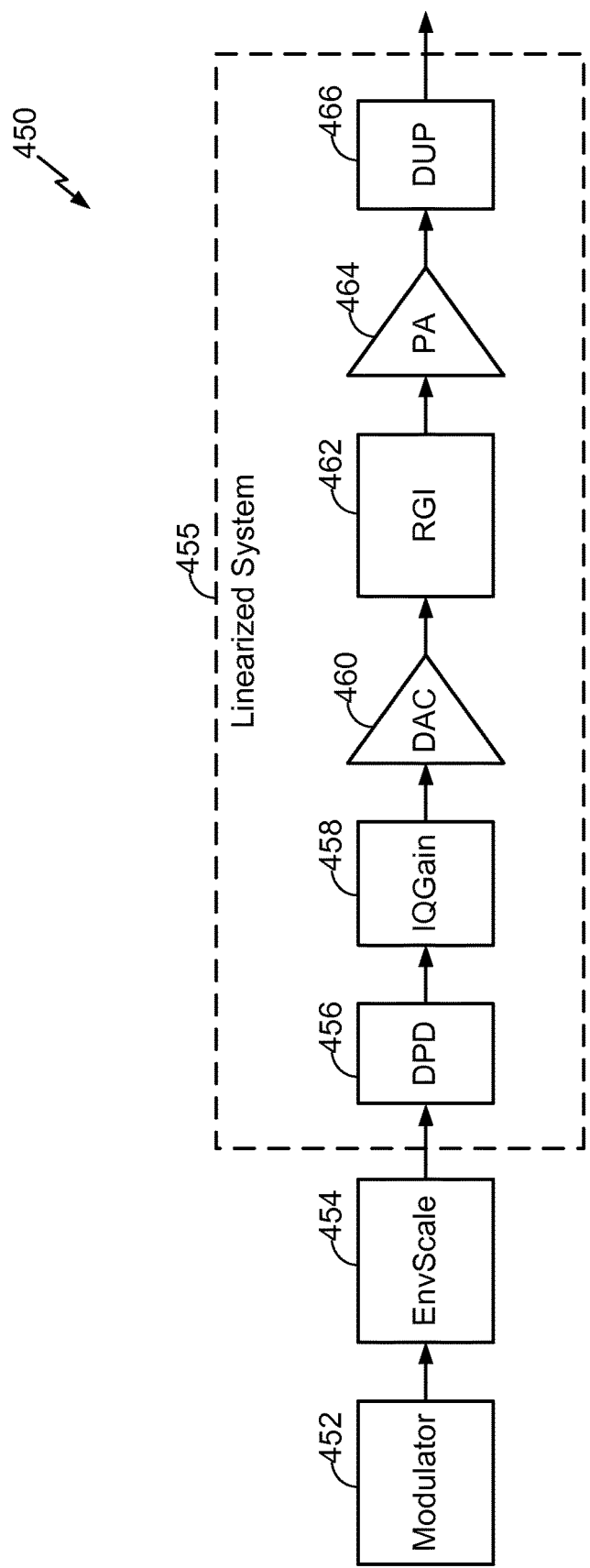
FIG. 5 is a more detailed illustration of a device that that may be used for carrying out various embodiments of the present invention.

FIG. 4 illustrates a device 400, which is an example of a device that may be used for carrying out various embodiments of the present invention. Device 400 includes a digital pre-distortion (DPD) unit 402, gain unit 404, and a power amplifier 406. It is noted that gain unit 404 may be varied to adjust an input power alignment value of power amplifier 406 for carrying out the method described above. FIG. 5 is a more detailed description of a device 450, which may be used for carrying out various embodiments of the present invention. Device 450 includes a modulator 452, an envelope scale 454, and a linearized system 455. Linearized system 455 includes a digital pre-distortion (DPD) unit 456, an IQ Gain unit 458, a digital-to-analog converter (DAC) 460, an RF gain index 462, a power amplifier 464, and a duplexer 466. As noted above, according to one exemplary embodiment of the present invention, ACLR may be measured for various input power value alignments across a plurality of frequency channels. According to one exemplary embodiment, IQ Gain unit 458, RF gain index 462, or both, may be varied to modify the input power value alignment for measuring the ACLR to determine an optimal input power alignment value. Device 400 may further include a processor (e.g., processor 110 of FIG. 1) for determining optimal input power alignment values for each frequency and temperature (i.e., based on measured ACLRs), and memory (e.g., memory 112 of FIG. 1) for storing the optimal input power alignment values. It is noted that the methods described herein including determining optimal input power alignment values of a power amplifier for various frequency channels and temperatures may be performed during device manufacture (e.g., at the factory).

Figure 6:
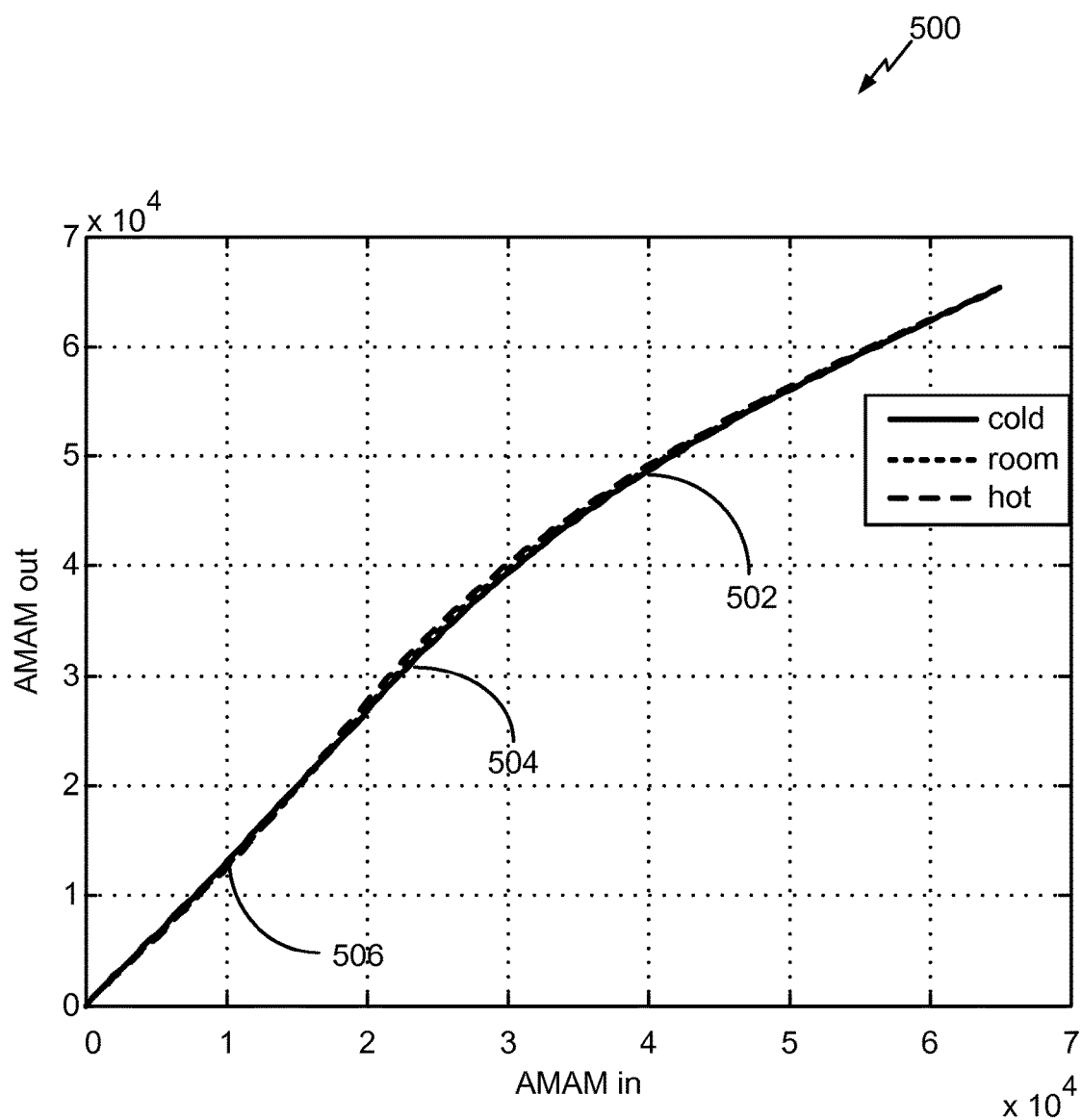
FIG. 6 is a plot illustrating an amplitude-to-amplitude modulation (AM-AM) response of a power amplifier of a transmitter configured for varying input power values of the power amplifier in accordance with an exemplary embodiment of the present invention.

FIG. 6 is a plot 500 illustrating a response of a power amplifier of a transmitter configured for varying input power alignment values according to the input power alignment value compensation method described above. More specifically, a curve 502 illustrates an amplitude-to-amplitude modulation (AM-AM) response of the power amplifier at a "cold" temperature, a curve 504 illustrates an AM-AM response of the power amplifier at "room" temperature, and curve 506 illustrates an AM-AM response of the power amplifier at a "hot" temperature, after the optimal input power alignment compensation is applied as described above. As illustrated in plot 500, each of curves 502, 504, and 506 are hardly distinguishable.

Figure 7:
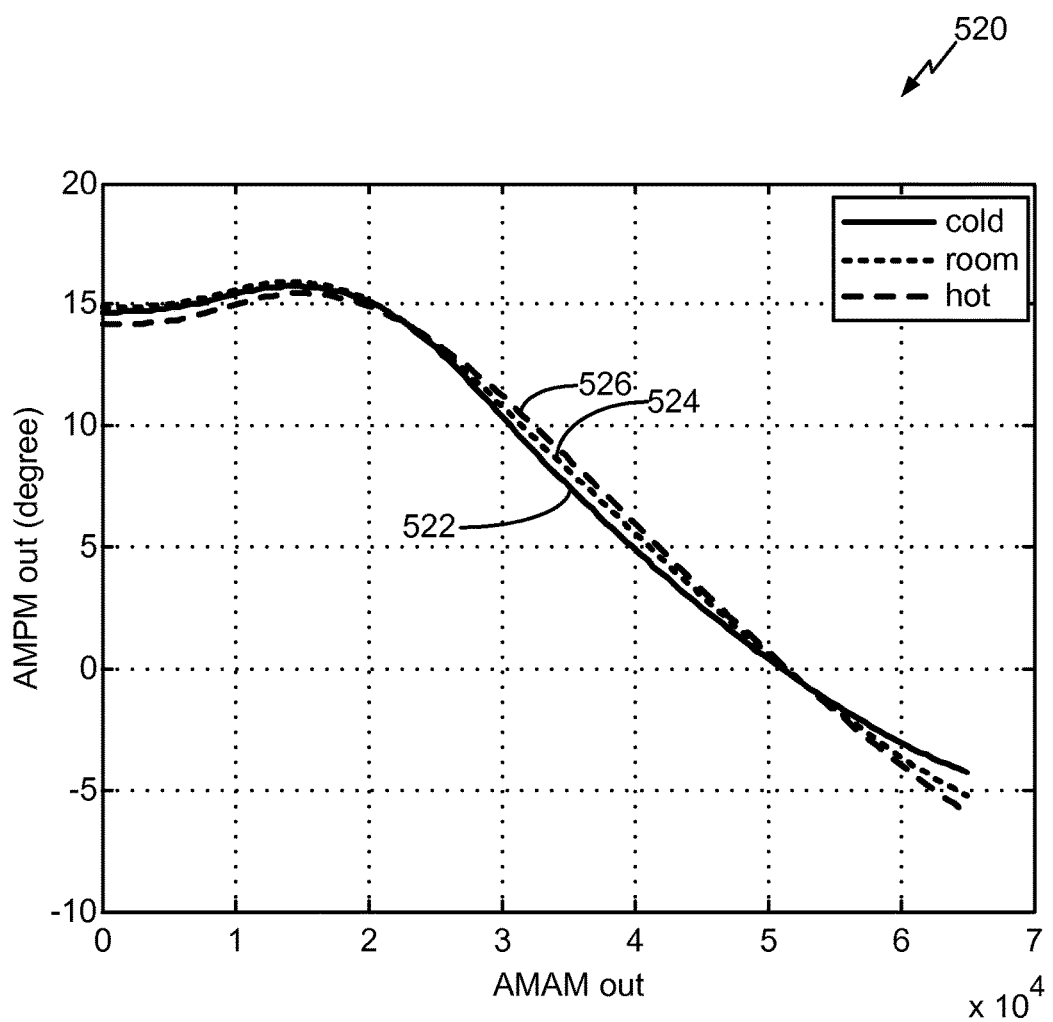
FIG. 7 is another plot illustrating an amplitude-to-phase modulation (AM-PM) response of a power amplifier of a transmitter configured for varying input power values of the power amplifier according to an exemplary embodiment of the present invention.

FIG. 7 is a plot 520 illustrating a response of a power amplifier of a transmitter configured for varying input power alignment values according to the input power alignment value compensation method described above. More specifically, a curve 522 illustrates an amplitude-to-phase modulation (AM-PM) response of the power amplifier at a "cold" temperature, a curve 524 illustrates an AM-PM response of the power amplifier at "room" temperature, and curve 526 illustrates an AM-PM response of the power amplifier at a "hot" temperature after the optimal input power alignment compensation is applied as described above. As illustrated in plot 520, each of curves 522, 524, and 526 are hardly distinguishable.

Figure 8:
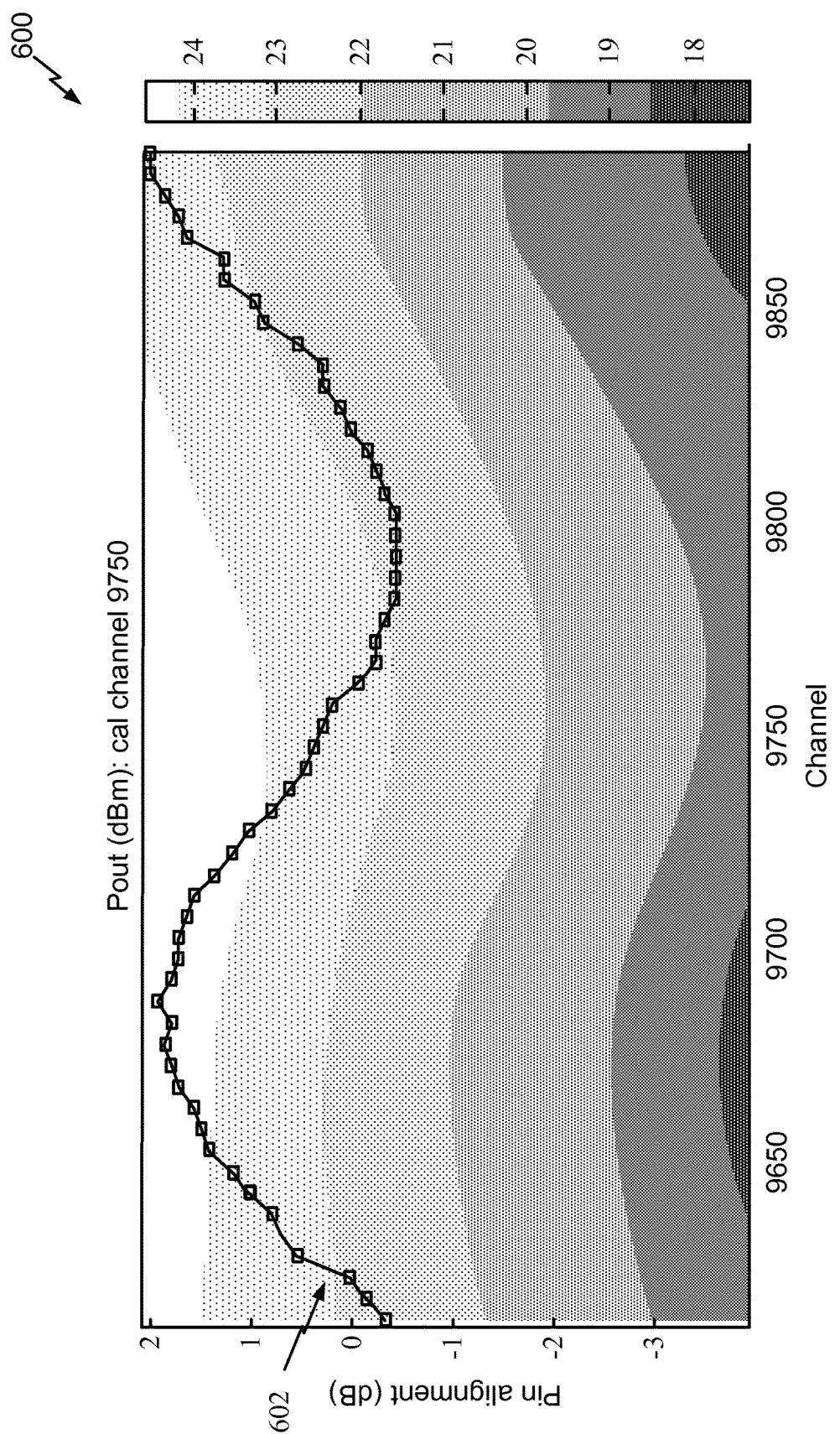
FIG. 8 is a grayscale plot illustrating output power levels of a power amplifier across a plurality of input power values and a plurality of frequency channels.
Figure 9:
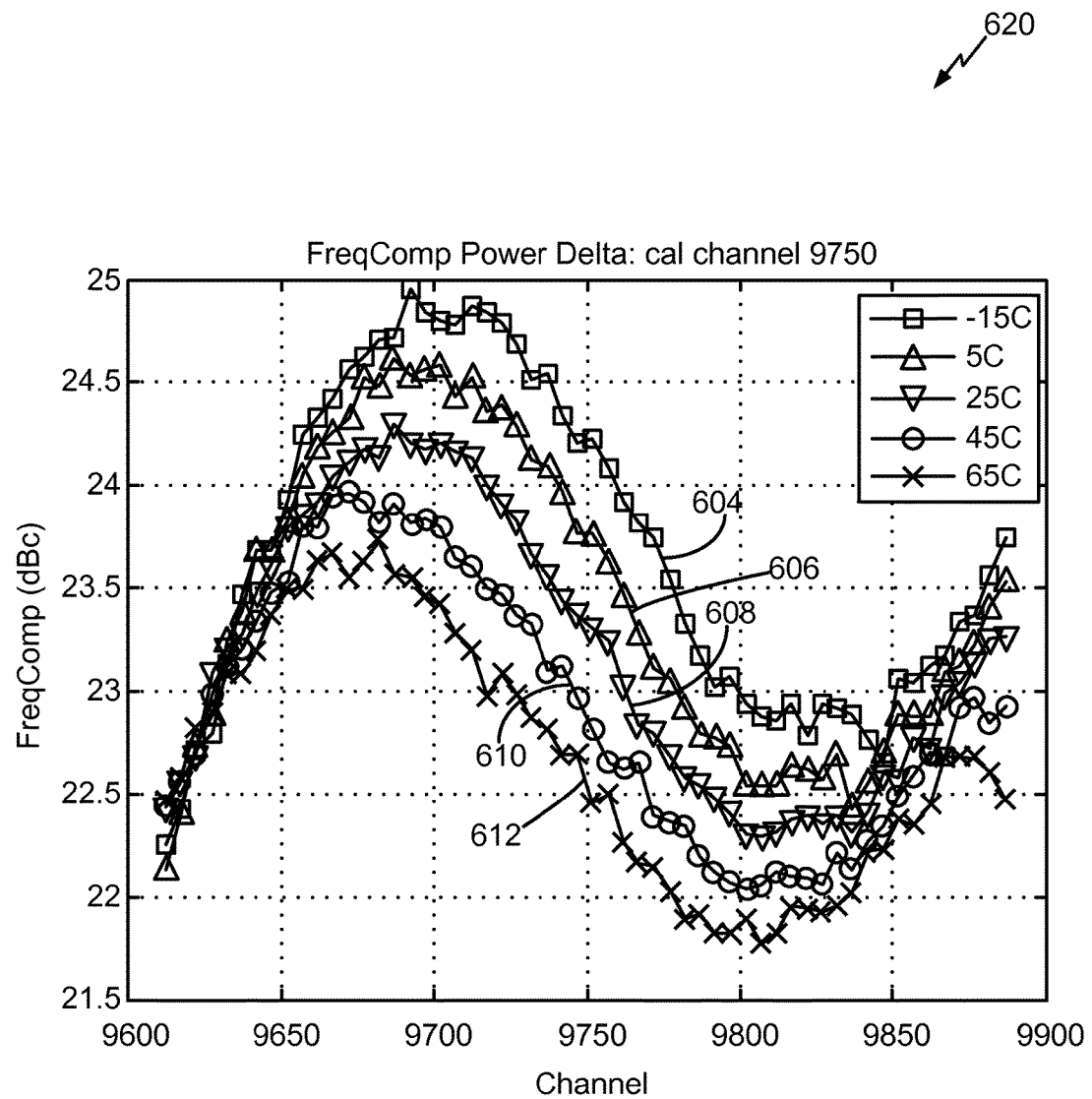
FIG. 9 is a plot depicting frequency compensated output power values of a power amplifier across a plurality of frequency channels for a plurality of temperatures.

FIG. 8 is a grayscale plot 600 of an output power level of a power amplifier (e.g., power amplifier 464 of FIG. 5) of a transmitter across a plurality of input power alignment values and a plurality of frequency channels. Further, plot 600 includes a curve 602 illustrating an optimal input power alignment value relative to frequency channels. With reference to plot 620 of FIG. 9, curves 604, 606, 608, 610, and 612 depict output power values, with optimal input power alignment, across a plurality of frequency channels for temperatures of −15 degrees Celsius, 5 degrees Celsius, 25 degrees Celsius, 45 degrees Celsius, and 65 degrees Celsius, respectively. As illustrated in each of FIGS. 8 and 9, the output power of the power amplifier with optimal input power alignment exhibits residual output power variations of the power amplifier and duplexer due to their responses to frequency and temperature.

Another exemplary embodiment of the present invention includes a method of characterizing an output power value of a power amplifier of a transmitter across frequency and temperature. The method may include applying the determined optimal static input power alignment value across frequency channels, and measuring output power variations at room temperature. Further, the method may include recording output power value versus frequency and temperature to characterize the output power of the power amplifier (i.e., determine an output power variation). More specifically, the method may include determining a difference between output power curves of all frequencies and temperatures and the output power at room temperature and DPD-calibration channel to determine an output power variation after the input power alignment is applied. Further, the method may include compensating the output power by transmit power control and adjusting a gain of the transmitter outside the DPD linearized system. More specifically, with reference to FIG. 5, a digital gain of the transmitter may be adjusted (e.g., via envelope scale 454) to compensate for the output power of power amplifier 464.

It is noted that the exemplary embodiments, as described above, provide for separate compensation of input power and output power values of a power amplifier of a wireless transmitter across frequency and temperature. The input power alignment is determined given optimal ACLRs and its impact is separated from the output power variations, which are determined after the optimal input power alignment is applied. In comparison to conventional devices, the present invention does not require DPD calibration for each temperature and frequency channel. Thus, the present invention may reduce the number of calibration channels and reduce the required calibration time of a wireless transmitter. Further, online ACLR and output power performance across channels are improved.

In accordance with yet another exemplary embodiment of the present invention, an optimal input power alignment value of a power amplifier of a wireless transmit signal may be dynamically determined via feedback from a transmit path. More specifically, according to one exemplary embodiment, during device operation, the power amplifier input power value (Pin) may be dithered by a fraction of the input power value (e.g., by +0.1 dB and −0.1 dB consecutively within a duration of constant transmit power), and a difference in power amplifier output power values (i.e., as a result of the dithering the power level of the transmit signal) may be measured. In addition, a ratio of the difference in the input power values (Pin difference) to the difference in the output power values (Pout difference) may be determined. Stated another way, a slope equal to an output power difference divided by an input power difference may be calculated (slope=Pout difference/Pin difference). Moreover, the input power value (Pin) may be adjusted to provide a target slope.

As an example, if a current known optimal input power (Pin) is 2 dB, during operation, by default, 2 dB may be applied in terms of IQGain/RGI (458/462 in FIG. 5). Further, the dither may be applied as follows: for a period of time, an input power (Pin) of 1.9 dB (i.e., 2−0.1) may be applied by adjusting IQGain 458 accordingly; and for the consecutive period of time, an input power (Pin) of 2.1 dB (i.e., 2+0.1) may be applied by IQGain 458. For both cases, the output power (Pout) may be measured (i.e., Pout at 1.9 dB Pin and Pout at 2.1 dB Pin). Subsequently, a ratio [(Pout(2.1 dB)−Pout(1.9 dB))/(2.1 dB−1.9 dB)] may be compared with a target slope, and may be used to judge if the current input power Pin (2 dB) is optimal. If not, the input power Pin may be adjusted accordingly.

According to another exemplary embodiment of the present invention, a method may include dynamically determining an input power level via AM-AM construction. More specifically, the method may include capturing in-phase and quadrature (IQ) samples and constructing an AM-AM table from the captured IQ samples. Further, the method may include calculating a compression of the power amplifier based on the AM-AM table. Moreover, the method may include adjusting an input power level of the power amplifier to reach a target compression point. It is noted that this embodiment includes capturing IQ samples after a digital pre-distortion (DPD) unit and before an IQ gain unit (e.g., after DPD unit 702 and before IQ gain unit 704, as illustrated in FIG. 10).

Figure 10:
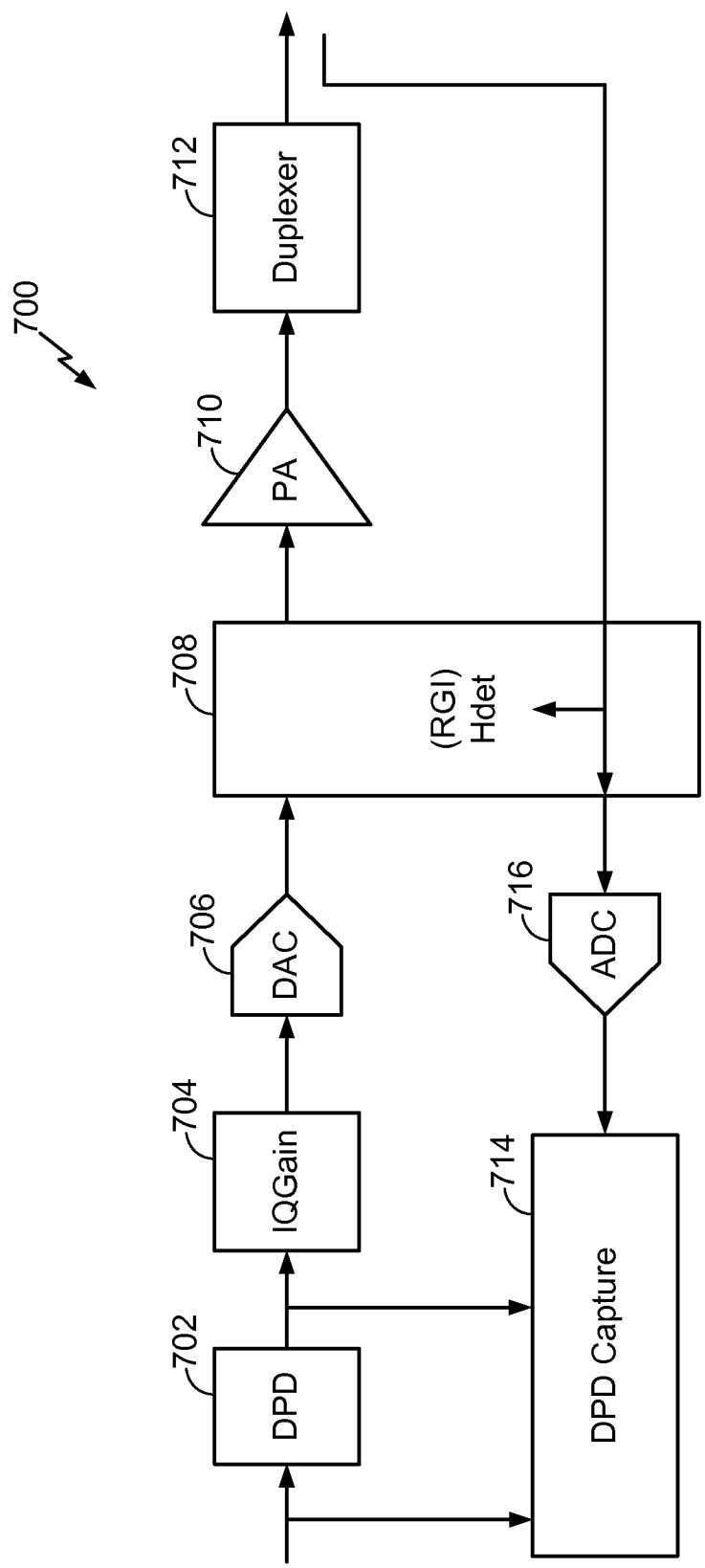
FIG. 10 illustrates a device, which is an example device for carrying out various exemplary embodiments of the present invention.

Another example, which is especially useful for Envelope Tracking (ET) technology for which the above IQ capture AM-AM compression point method does not work, IQ capture before a DPD unit (e.g., as the vertical line before the DPD unit 702 in FIG. 10). If the power amplifier input power alignment is optimal, the system, including from a DPD unit to a power amplifier, is a whole linear system. Accordingly, IQ capture before a DPD unit may lead to a linear AM-AM curve and 0 dB compression at its peak. However, if the current input power alignment is larger than the optimal, the AM-AM curve will show positive compression at its peak; on the other hand, if the current input power alignment is smaller than the optimal, the AM-AM curve will show negative compression at its peak. Thus, this example may include adjusting the input power (Pin) based on the compression at the peak of AM-AM constructed by IQ capture before the DPD unit.

FIG. 10 illustrates a device 700, which is an example device that may be used for carrying out various exemplary embodiments of the present invention. Device 700 includes a digital pre-distortion (DPD) unit 702, an IQ gain unit 704, a DAC 706, an RF gain index 708, a power amplifier 710, and a duplexer 712. Further, device 700 includes a digital pre-distortion (DPD) capture unit 714 and an ADC 716. According to one exemplary embodiment, RF gain index 708 may include a power detector for detecting power levels of a signal that is input to power amplifier 710 (i.e., input power level) and a signal that is output from power amplifier 710 (i.e., output power level). Moreover, DPD capture unit 714 may be configured for capturing IQ samples. Further, IQ gain unit 704, RF gain index 708, or both, may be adjusted to adjust the input power level to provide a target slope or a target compression point. Device 700 may further include a processor (e.g., processor 110 of FIG. 1) for performing the processes described herein (e.g., dithering, calculations, AM-AM table construction, and power value adjustments) and memory (e.g., memory 112 of FIG. 1) for storing the data related to the processes.

Figure 11:
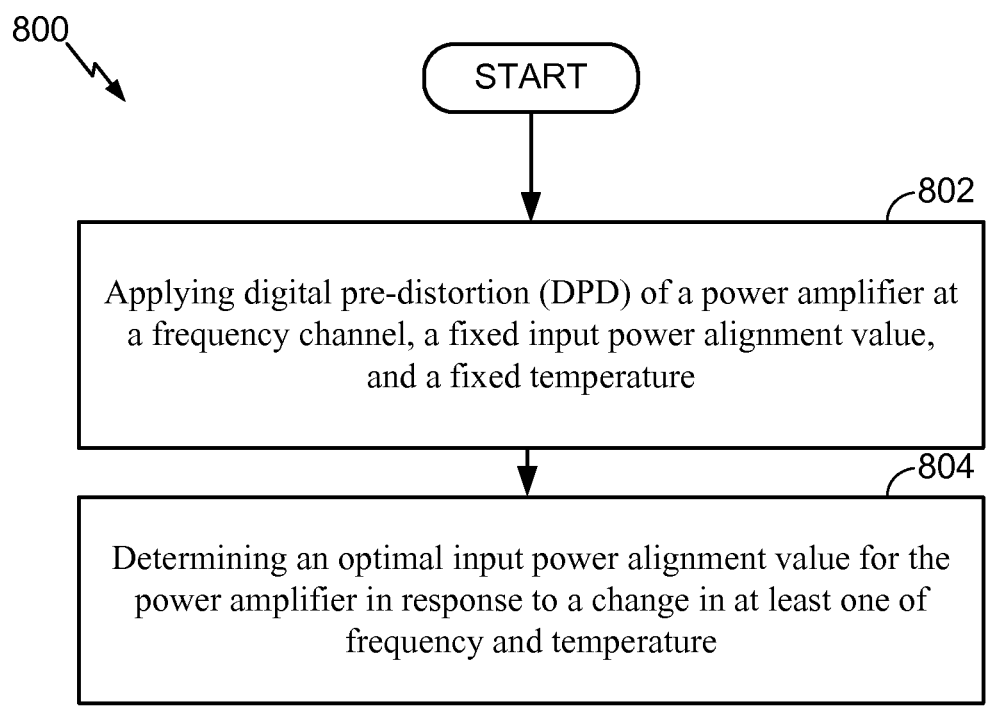
FIG. 11 is a flowchart depicting a method, in accordance with an exemplary embodiment of the present invention.

FIG. 11 is a flowchart illustrating a method 800, in accordance with one or more exemplary embodiments. Method 800 may include calibrating digital pre-distortion (DPD) of a power amplifier at a frequency channel, a fixed input power alignment value, and a fixed temperature (depicted by numeral 802). Method 800 may also include measuring adjacent channel leakage ratios (ACLRs) for a plurality of input power alignment values and a plurality of frequency channels with the calibrated DPD (depicted by numeral 804).

Figure 12:
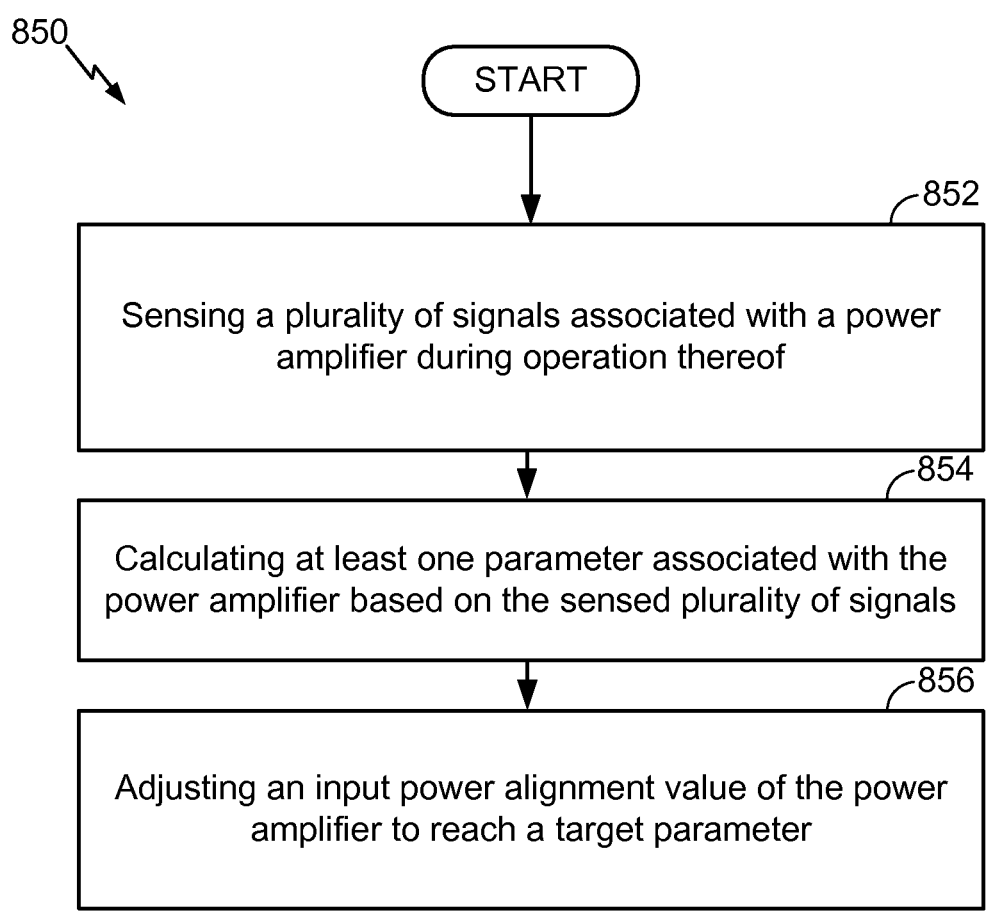
FIG. 12 is a flowchart depicting another method, in accordance with an exemplary embodiment of the present invention.

FIG. 12 is a flowchart illustrating a method 850, in accordance with one or more exemplary embodiments. Method 850 may include sensing a plurality of signals associated with a power amplifier during operation thereof (depicted by numeral 852). For example, an output power difference and an input power difference as a result of dithering a power level of a wireless transmitter may be sensed. As another example, IQ samples may be sensed. Method 850 may also include calculating at least one parameter associated with the power amplifier based on the sensed plurality of signals (depicted by numeral 854). For example, a ratio of the difference in the input power level (Pin difference) to the difference in the output power level (Pout difference) may be determined. As another example, a compression of the power amplifier based on a constructed AM-AM table may be calculated. Further, method 850 may include adjusting an input power alignment value of the power amplifier to reach a target parameter (depicted by numeral 856). For example, the input power alignment value may be adjusted to provide a target slope (i.e., equal to an output power difference divided by an input power difference). As another example, the input power alignment value of the power amplifier may be adjusted to reach a target compression point.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method, comprising:
    applying digital pre-distortion (DPD) of a power amplifier at a frequency channel, a fixed input power alignment value, and a fixed temperature; and
    determining an optimal input power alignment value for the power amplifier in response to a change in at least one of frequency and temperature, the determining including measuring adjacent channel leakage ratios (ACLRs) for a plurality of input power alignment values and a plurality of frequency channels with the DPD at a plurality of temperatures, and selecting the optimal input power alignment value for the power amplifier for each frequency channel of the plurality of frequency channel based on the measured ACLRs;
    applying the DPD and the optimal input power alignment value across frequency channels and temperature;
    measuring and recording output power variations of the power amplifier versus frequency and temperature; and
    determining optimal input power value curve for each temperature of the plurality of temperatures across each frequency channel of the plurality of frequency channels by selecting an optimal static input power alignment value for the power amplifier for each frequency channel of the plurality of frequency channel and for each temperature of the plurality of temperature based on the measured ACLRs.

2. The method of claim 1, wherein the applied DPD may be characterized a priori or calibrated.

3. The method of claim 1, wherein selecting an optimal static input power alignment value comprises selecting, for each frequency channel, a static input power alignment value that corresponds to an optimal ACLR.

4. The method of claim 1, further comprising varying the input power alignment values when applying the DPD onto any frequency channel and temperature.

5. The method of claim 1, further comprising adjusting a gain to compensate the output power variation.

6. The method of claim 1, wherein determining comprises:
    dithering a power level of a transmit signal;
    measuring a difference in input power levels of the power amplifier and a difference in output power levels of the power amplifier in response to dithering the power level of the transmit signal; and
    adjusting the input power alignment value to achieve a desired ratio of the difference in the output power levels with respect to the difference in the input power levels.

7. The method of claim 6, wherein dithering comprises dithering a power level of the transmit signal by a fraction of the power level.

8. The method of claim 6, wherein adjusting comprises adjusting the input power alignment value to achieve a target slope equal to the difference in output power values divided by the difference in input power values.

9. The method of claim 1, wherein determining comprises:
    capturing in-phase and quadrature (IQ) samples of a transmit signal;
    constructing an amplitude-to-amplitude (AM-AM) table from the IQ samples; and
    calculating a compression of the power amplifier based on the AM-AM table.

10. The method of claim 9, further comprising adjusting the input power alignment value based on characteristics of an AM-AM curve.

11. A device, comprising:
    means for applying digital pre-distortion (DPD) of a power amplifier at a frequency channel, a fixed input power alignment value, and a fixed temperature; and
    means for determining an optimal input power alignment value for the power amplifier in response to a change in at least one of frequency and temperature, wherein the means for determining comprises means for measuring adjacent channel leakage ratios (ACLRs) for a plurality of input power alignment values and a plurality of frequency channels and temperatures with a calibrated DPD at a plurality of temperatures, means for selecting the optimal static input power alignment value for the power amplifier for each frequency channel of the plurality of frequency channel based on the measured ACLRs;

means for applying the DPD and optimal static input power alignment onto a frequency and temperature during operation;

means for measuring and recording output power variations of the power amplifier versus frequency and temperature; and means for determining optimal input power value curve for each temperature of the plurality of temperatures across each frequency channel of the plurality of frequency channels by selecting an optimal static input power alignment value for the power amplifier for each frequency channel of the plurality of frequency channel and for each temperature of the plurality of temperature based on the measured ACLRs.

12. The device of claim 11, wherein the means for determining comprises:

means for dithering a power level of a transmit signal;

means for measuring a difference in input power levels of the power amplifier and a difference in output power levels of the power amplifier in response to dithering the power level of the transmit signal; and means for adjusting the input power alignment value to achieve a desired ratio of the difference in the output power levels with respect to the difference in the input power levels.

13. The device of claim 11, wherein the means for determining comprises:

means for capturing in-phase and quadrature (IQ) samples of a transmit signal;

means for constructing an amplitude-to-amplitude (AM-AM) table from the IQ samples;

means for calculating at least one parameter based on the AM-AM table; and means for adjusting the input power alignment value based on the at least one parameter.

* * * * *